United States Patent
Young et al.

(10) Patent No.: US 7,316,956 B2
(45) Date of Patent: Jan. 8, 2008

(54) METHOD FOR FABRICATING SEMICONDUCTOR DEVICE AND WIRE WITH SILICIDE

(75) Inventors: Rex Young, Hsinchu (TW); Liang-Chuan Lai, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 133 days.

(21) Appl. No.: 11/163,892

(22) Filed: Nov. 3, 2005

(65) Prior Publication Data

US 2006/0252210 A1 Nov. 9, 2006

(30) Foreign Application Priority Data

May 6, 2005 (TW) .................... 94114668 A

(51) Int. Cl.
*H01L 21/336* (2006.01)

(52) U.S. Cl. ............... 438/268; 438/242; 438/270; 257/E29.262

(58) Field of Classification Search ........ 438/242–249, 438/386–392, 268–273, 257–267; 257/E29.262
See application file for complete search history.

(56) References Cited

U.S. PATENT DOCUMENTS

| 6,091,102 A * | 7/2000 | Sekariapuram et al. ..... 257/316 |
| 6,207,541 B1 * | 3/2001 | Das et al. .................... 438/585 |
| 6,251,778 B1 * | 6/2001 | Fang et al. ................. 438/682 |
| 2002/0061639 A1 * | 5/2002 | Itonaga ...................... 438/592 |
| 2003/0017657 A1 * | 1/2003 | Han .......................... 438/149 |

* cited by examiner

*Primary Examiner*—H. Jey Tsai
(74) *Attorney, Agent, or Firm*—Jianq Chyun IP Office

(57) ABSTRACT

A method for fabricating a wire with silicide is disclosed. First, a conductive layer is formed on a substrate. And, a hard mask layer is formed on the conductive layer. Then, the hard mask layer is used as a mask to remove a portion of the conductive layer. Afterwards, a spacer is formed on the sidewalls of the conductive layer and the hard mask layer. Afterwards, the hard mask layer is removed. Next, a silicide is formed on the conductive layer.

11 Claims, 13 Drawing Sheets

METHOD FOR FABRICATING SEMICONDUCTOR DEVICE AND WIRE WITH SILICIDE

CROSS-REFERENCE TO RELATED APPLICATION

This application claims the priority benefit of Taiwan application serial no. 94114668, filed on May 6, 2005. All disclosure of the Taiwan application is incorporated herein by reference.

BACKGROUND OF THE INVENTION

1. Field of Invention

The present invention relates to a method for fabricating semiconductor device and word wire. More particularly, the present invention relates to a method for fabricating semiconductor device and word wire with self-aligned silicide (salicide).

2. Description of Related Art

Along with the increase of the integrity of semiconductor devices, the pattern and wire width within the device are also reduced gradually, which causes the resistance at the contact point of gate and wire to increase and creates big RC delay, and further affects the device operation speed. As the resistance of silicide is lower than polysilicon and the thermal stability thereof is higher than common inter-connection material, the silicide can be formed on the gate to reduce the resistance between the gate and the metal connection wire. Since there is no need for a photolithographic process in the fabrication of the silicide, the silicide fabricated by such process is also called self-aligned silicide (salicide).

In another aspect, as the exposed surface portion of the polysilicon may form a native oxide layer, in the fabricating process of salicide, the native oxide layer may lead to bad quality of silicide membrane and increased sheet resistance, such that the efficiency of gate operation is adversely affected. Therefore, when the salicide is formed on the polysilicon gate, usually a pre-sputtering process may be performed on the surface of the polysilicon first to remove the native oxide layer on the surface of polysilicon.

However, while performing the pre-sputtering process, the ions smash against the polysilicon surface and a lot of polysilicon pieces may scatter on the substrate. After the process of the salicide, the polysilicon piece may also form silicide, which can result in a bridge phenomenon among conductors (for example, electrode, wire, etc.). For example, the bridge of the silicide resulted from the polysilicon pieces between two adjacent word wires in the memory cell array can cause electronic defects.

SUMMARY OF THE INVENTION

Accordingly, the present invention is directed to a method for fabricating a semiconductor device, which can avoid the random scattering phenomenon of polysilicon pieces when the pre-sputtering process is performed.

Another object of the present invention is to provide a method for fabricating word wire, which can avoid the electronic defects resulted from the bridge among conductors.

The present invention provides a method for fabricating semiconductor devices: First, a trench semiconductor device is formed on a substrate, wherein the trench semiconductor device protrudes in the substrate surface. Next, a first dielectric layer is formed on the trench semiconductor device. Then, a conductive layer is formed on the first dielectric layer. Thereafter, a patterned hard mask layer is formed on the conductive layer. Next, the hard mask layer serving as a mask, a portion of the conductive layer and a portion of the first dielectric layer are removed in sequence. Afterwards, a spacer is formed on the sidewalls of the first dielectric layer, the conductive layer and the patterned hard mask layer. Then, the patterned hard mask layer is removed. Next, a layer of silicide is formed on the conductive layer.

In the aforementioned method for fabricating the semiconductor device according to one embodiment of the present invention, the method for forming the trench semiconductor device is by: first, forming a trench on the substrate; then, forming a second dielectric layer, a second conductive layer and a third dielectric layer on the sidewalls of the trench in sequence, wherein the trench keeps an opening which exposes a portion of substrate. Afterward, a source wire is formed in the opening.

According to one embodiment of the present invention, the aforementioned method for fabricating the semiconductor device further includes performing a pre-sputtering process on the conductive layer before the silicide is formed on the conductive layer.

According to one embodiment of the present invention, the aforementioned method for fabricating the semiconductor device further includes: forming a source region and a drain region in the substrate on the two sidewalls of the spacer respectively after the spacer is formed on the sidewalls of the first dielectric layer, the conductive layer and the patterned hard mask layer and before the patterned hard mask layer is removed.

According to one embodiment of the present invention, the aforementioned method for fabricating the semiconductor device further includes: forming a silicide on the source region and drain region.

In the aforementioned method for fabricating the semiconductor device according to one embodiment of the present invention, the method for forming the patterned hard mask layer further includes: forming a hard mask layer on the conductive layer; next, forming a patterned photoresist layer on the hard mask layer; afterwards, using the patterned photoresist layer as a mask, and removing a portion of the hard mask layer; next, removing the patterned photoresist layer.

In the aforementioned method for fabricating the semiconductor device according to one embodiment of the present invention, the method for forming a spacer on the sidewalls of the first dielectric layer, the conductive layer and patterned hard mask layer includes: forming an conformal insulation layer on the substrate; next, performing a non-isotropic etching process on the insulation layer.

In the aforementioned method for fabricating the semiconductor device according to one embodiment of the present invention, the method for forming the silicide includes: first, forming a conformal metal layer on the substrate; then, performing a thermal process on the metal layer to cause the metal layer to react with the conductive layer to generate a silicide layer; afterwards, removing the metal layer that has not reacted.

In the aforementioned method for fabricating the semiconductor device according to one embodiment of the present invention, the material of the patterned hard mask layer includes silicon oxide.

In the aforementioned method for fabricating the semiconductor device according to one embodiment of the present invention, the material of the spacer includes silicon nitride.

In the aforementioned method for fabricating the semiconductor device according to one embodiment of the present invention, the material of the silicide includes cobalt silicate or tungsten silicate.

The present invention provides a method for fabricating a wire with silicide, in which a conductive layer is formed on a substrate first, and a hard mask layer is formed on the conductive layer. Next, a spacer is formed on the sidewalls of the conductive layer and the hard mask layer. Next, the hard mask layer is removed. Afterwards, a silicide is formed on the conductive layer.

In the aforementioned method for fabricating the wire with silicide according to one embodiment of the present invention, the method for forming the patterned conductive layer includes: first, forming the hard mask layer on a conductive layer; afterwards, using the mask layer as a mask, and removing a portion of the conductive layer to form the patterned conductive layer.

In the aforementioned method for fabricating the wire with silicide according to one embodiment of the present invention, a plurality of memory cells have been formed in the substrate, and the surface thereof is covered by an insulation layer.

In the aforementioned method for fabricating the wire with silicide according to one embodiment of the present invention, these memory cells include trench flash memory cells.

In the aforementioned method for fabricating the wire with silicide according to one embodiment of the present invention, the method for forming the patterned hard mask layer includes: first, forming a hard mask layer on the conductive layer; next, forming a patterned photoresist layer on the hard mask layer; next, using the patterned photoresist layer as a mask, and removing a portion of the hard mask layer; afterwards, removing the patterned photoresist layer.

According to one embodiment of the present invention, the aforementioned method for fabricating the wire with silicide further includes performing a pre-sputtering process on the conductive layer before the silicide is formed on the conductive layer.

In the aforementioned method for fabricating the wire with silicide according to one embodiment of the present invention, the method for forming the spacer on the sidewalls of the conductive layer and hard mask layer includes: first, forming a conformal insulation layer on the substrate; next, performing a non-isotropic etching process on the insulation layer.

In the aforementioned method for fabricating the wire with silicide according to one embodiment of the present invention, the method for forming the silicide includes: first, forming a conformal metal layer on the substrate; then, performing a thermal process on the metal layer to cause the metal layer to react with the conductive layer to generate a silicide layer; afterwards, removing the metal layer that has not reacted.

In the aforementioned method for fabricating the wire with silicide according to one embodiment of the present invention, the material of the hard mask layer includes silicon oxide, and the material of the spacer includes silicon nitride.

In the method for fabricating the semiconductor device and the wire with silicide according to the present invention, as the hard mask layer on the conductive layer will not be removed until the spacer is formed, the height of the spacer is larger than that of the conductive layer. Accordingly, the polysilicon pieces may concentrate in the region among the spacers while performing the pre-sputtering process. Therefore, the polysilicon pieces scattering randomly on the substrate that form silicide can be prevented, and further, the electronic defect due to the bridge between the conductors can be avoided.

The objectives, other features and advantages of the invention will become more apparent and easily understood from the following detailed description of the invention when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF SOME EMBODIMENTS

Figure 1A:
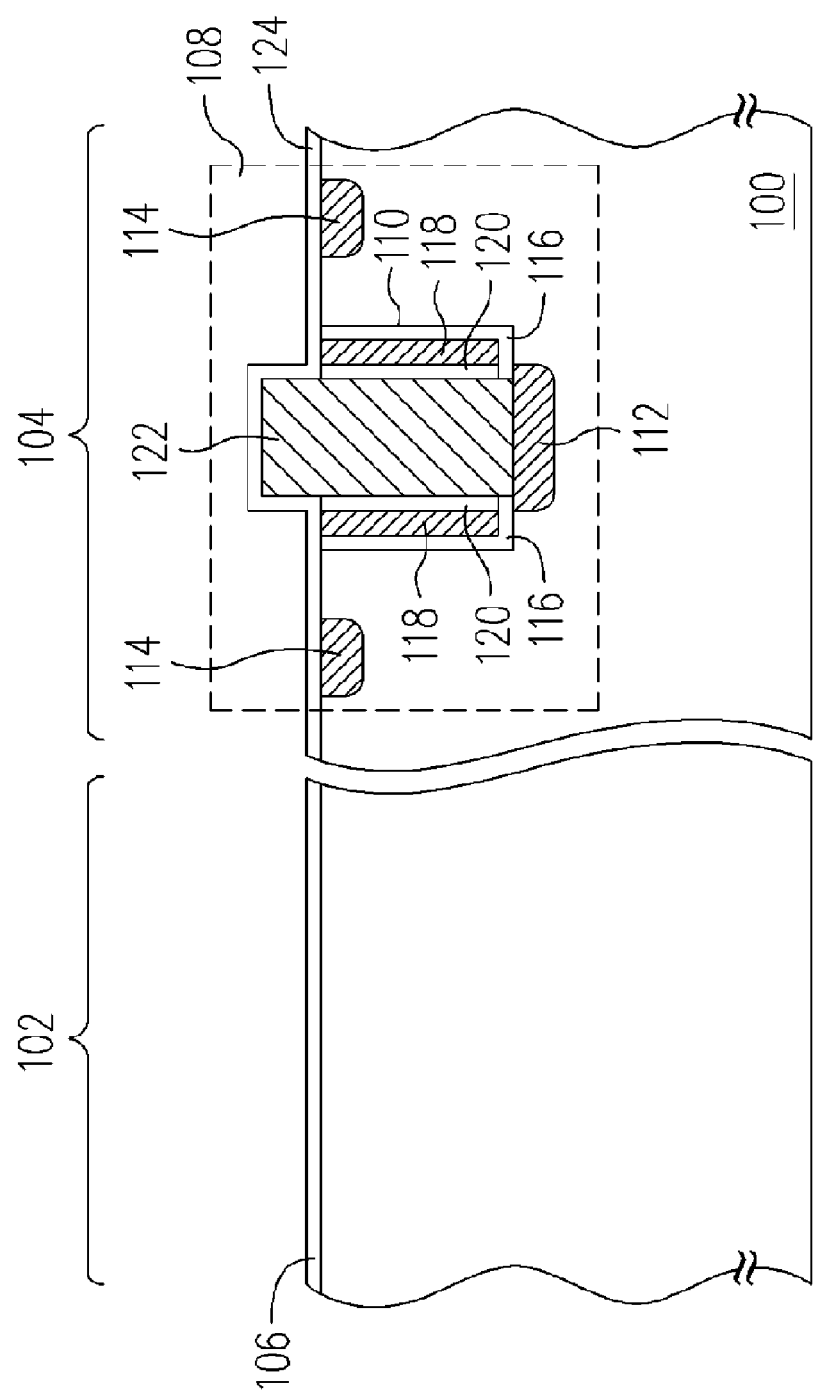
FIGS. 1A to 1F are cross-sectional views of the manufacturing process of the memory unit according to one embodiment of the present invention.

FIGS. 1A to 1F are cross-sectional views of the manufacturing process of the memory unit according to one embodiment of the present invention. Please refer to FIG. 1A. First, a semiconductor substrate 100 is provided, which is at least divided into a peripheral circuit region 102 and a memory cell region 104. Wherein, a gate dielectric layer 106 has been formed in the peripheral circuit region 102, which is made of, for example, silicon oxide, and formed by, for example, a thermal oxidation process.

Moreover, memory cell 108 has been formed in memory cell region 104. The memory cell 108 is, for example, a trench flash memory cell, including a semiconductor substrate 100, a source region 112, a drain line 114, a tunnel oxide layer 116, a floating gate 118, an inter-gate dielectric layer 120, a source line 122 and a dielectric layer 124.

In the semiconductor substrate 100 of the memory cell region 104, the tunnel oxide layer 116 is configured on the sidewalls of the trench 110 and the bottom of a portion of the trench 102. The source region 112 is configured in the semiconductor substrate 100 disposed on the bottom of the trench 110, and the drain line 114 is configured in the semiconductor substrate 100 on two sides of the trench 110. The two floating gates 118 are configured on the sidewalls of the trench 110 respectively, and on the tunnel oxide layer 116. The source line 122 is configured in the trench 110, and the top of the source line 122 is higher than the surface of the semiconductor substrate 100, wherein the material of the source line 122 is, for example, polysilicon. The inter-gate dielectric layer 120 is configured in the trench 110 and located between the floating gates 118 and the source line 122. Moreover, the dielectric layer 124 is configured on the surface of the source line 122 and the semiconductor substrate 100 on the side of the source line 122.

In the fabrication method of the aforementioned memory cell 108, for example, first, the trench 110 is formed in the semiconductor substrate 100, wherein, the method of forming the trench 110 is, for example, by forming a patterned mask layer (not shown) on the semiconductor substrate 100, wherein the material of the mask layer is, for example, silicon nitride, in a chemical vapor deposition process, for example. After that, the patterned mask layer serving as mask, the semiconductor substrate 100 is etched and the trench 110 is formed.

The tunnel oxide layer 116 is formed on the surface of the trench 110. Wherein, the material of the tunnel oxide layer 116 is, for example, silicon oxide, and the fabrication method is, for example, a thermal oxidation process.

Next, a conductive layer (not shown) is filled into the trench 110. After that, a portion of the conductive layer is removed until the surface of the semiconductor substrate 100 is exposed, and the method of removing the aforementioned portion of the conductive layer includes an etching back process which can be achieved by a chemical mechanic abrasion process. Then, the photolithographic etching process (patterning process) is performed on the conductive layer in order to form two floating gates 118. In one embodiment, after two floating gates 118 are formed, a source region 112 is formed in the semiconductor substrate 100 disposed on the bottom of the trench 110, and the fabrication method includes, for example, an ion implanting process.

Then, the inter-gate dielectric layer 120 is formed on the semiconductor substrate 100, wherein the inter-gate dielectric layer 120 is, for example, an internal poly oxidation (IPO) layer. Next, a portion of the inter-gate dielectric layer 120 and the tunnel oxide layer 116 are removed, so as to keep an opening (not shown) in the trench 110, and a portion of the semiconductor substrate 100 is exposed at the bottom of the opening.

Figure 1B:
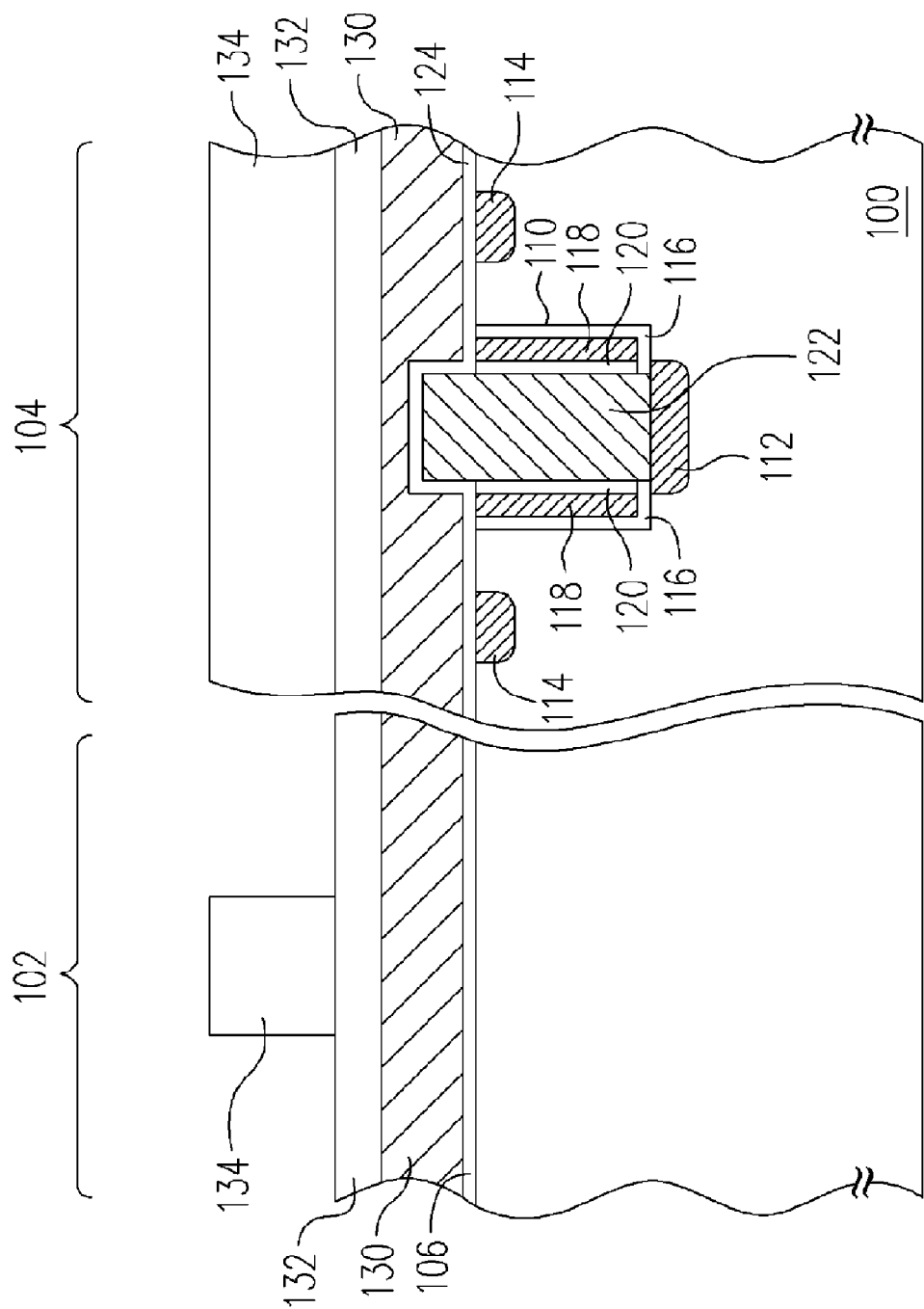
Figure 1C:
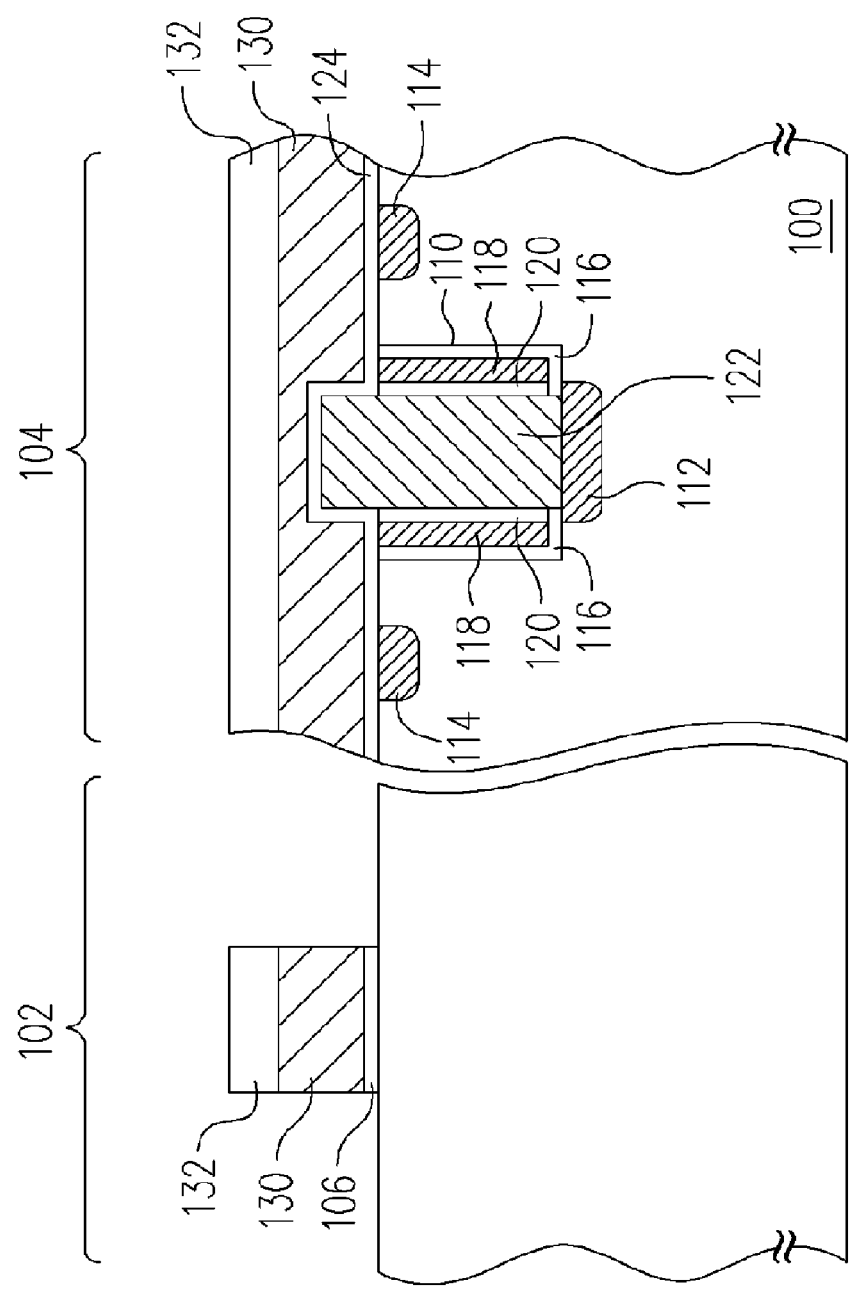

Next, please refer to FIG. 1C. A conductive column is filled into the opening to serve as a source line 122, wherein the material of the source line 122 is, for example, polysilicon, and the top of the column source line 122 is higher than the surface of the semiconductor substrate 100.

Figure 2:
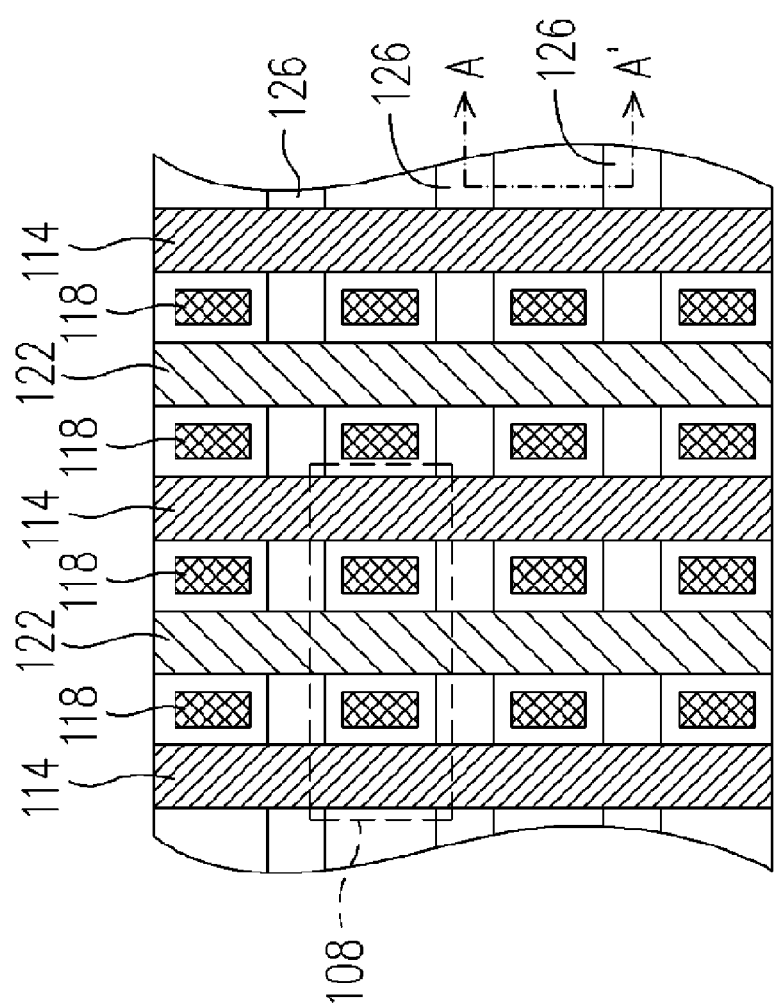
FIG. 2 is the top view of the memory cell region in FIG. 1A.

For a clear illustration of the arrangement mode of the memory cell array in the memory region 104, the top view of the memory cell 104 in FIG. 1A is shown in FIG. 2. Next, please refer to FIG. 2. In the memory array of the present invention, the source line 122 and the drain line 114 are parallel, and the floating gate 118 is configured on two sides of the source line 122. In addition, an isolation structure 126, such as a shallow trench isolation structure, is configured between the two memory cell arrays.

As the configuration direction of the word line formed subsequently in the memory cell region 104 is perpendicular to the source line 122, it is not easy to see the features of the manufacturing method of the word line of the present invention from the cross-sectional views of FIGS. 1A to 1F. The manufacturing method of the word line will be described in the following with reference to FIGS. 3A-3F showing the line A-A' in FIG. 2, and the manufacturing process in FIGS. 3A-3F corresponds to FIGS. 1A-1F.

Figure 3A:
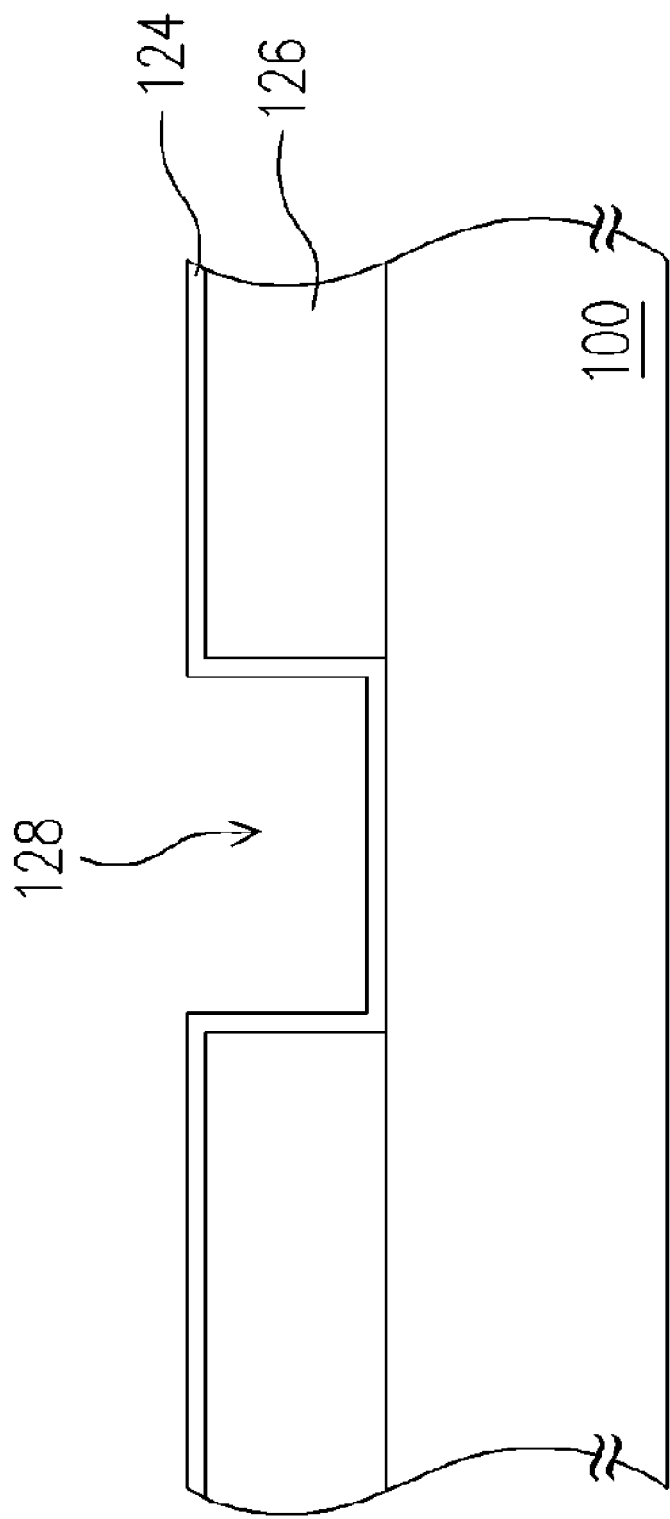
FIGS. 3A to 3F are cross-sectional views of the manufacturing process of the word wire of line A-A' in FIG. 2.

First, please refer to FIG. 3A, which is a schematic diagram of the other cross section (the line A-A' in FIG. 2) of FIG. 1A. In FIG. 3A, there are a plurality of isolation structures 126 on the semiconductor substrate 100, and a trench 128 is configured between the spacer structures 126. In addition, a dielectric layer 124 is configured on the surfaces of the isolation structure 126 and the trench 128.

Figure 3B:
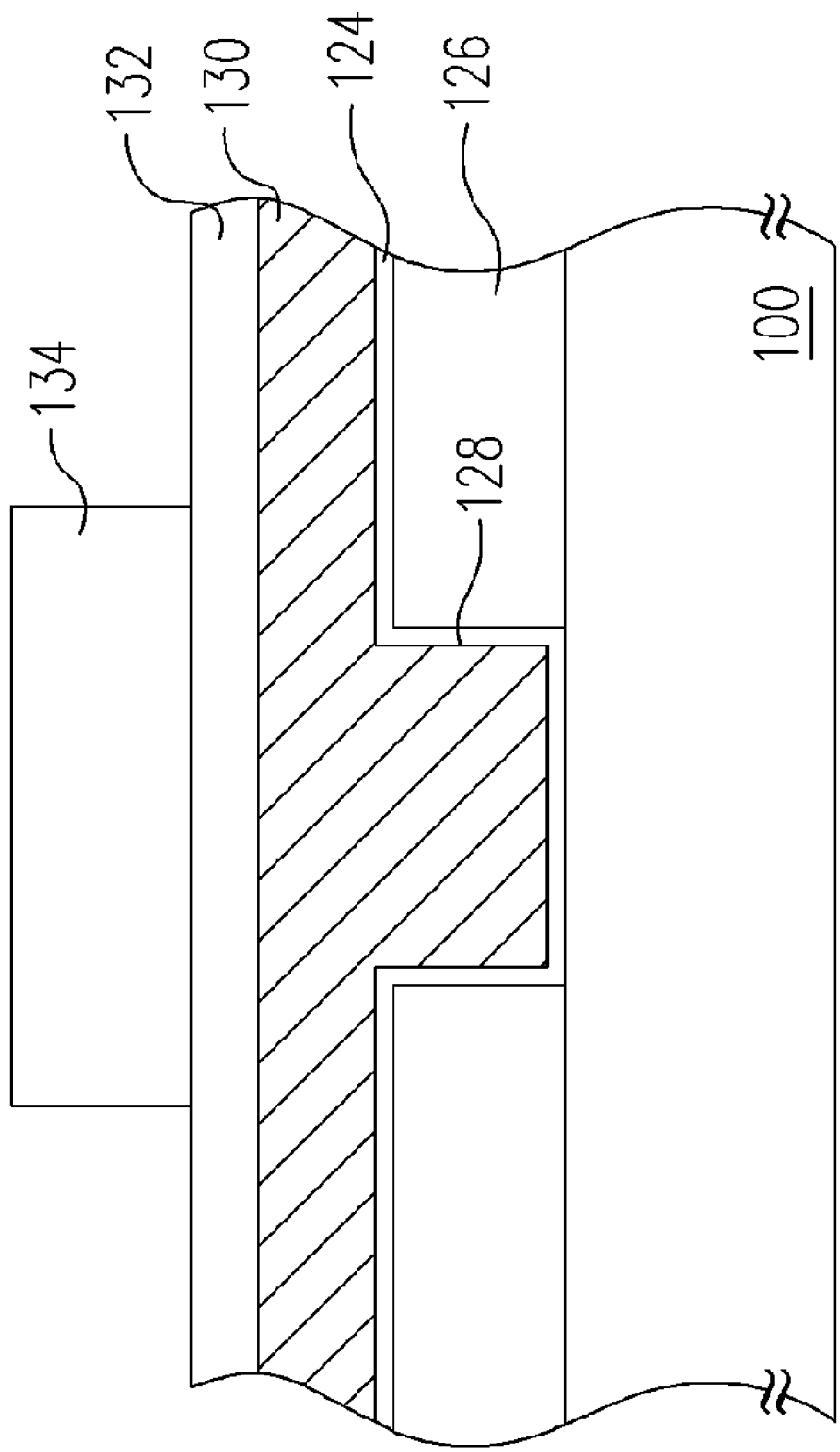

Next, please refer to FIGS. 1B and 3B. The conductive layer 130 is formed on the overall semiconductor substrate 100, covering the gate dielectric layer 106 and the dielectric layer 124, and filling the trench 128. Moreover, the material of the conductive layer 130 is doped polysilicon, and the fabrication method of that is, for example, by forming an un-doped polysilicon layer in a chemical vapor deposition process, and then forming the doped polysilicon in an ion implanting process. After that, a hard mask layer 132 is formed on the conductive layer 130, wherein the material is, for example, silicon oxide, and the fabrication method is, for example, a chemical vapor deposition process. Then, a patterned photoresist layer 134 is formed above the hard mask layer 132.

Figure 3C:
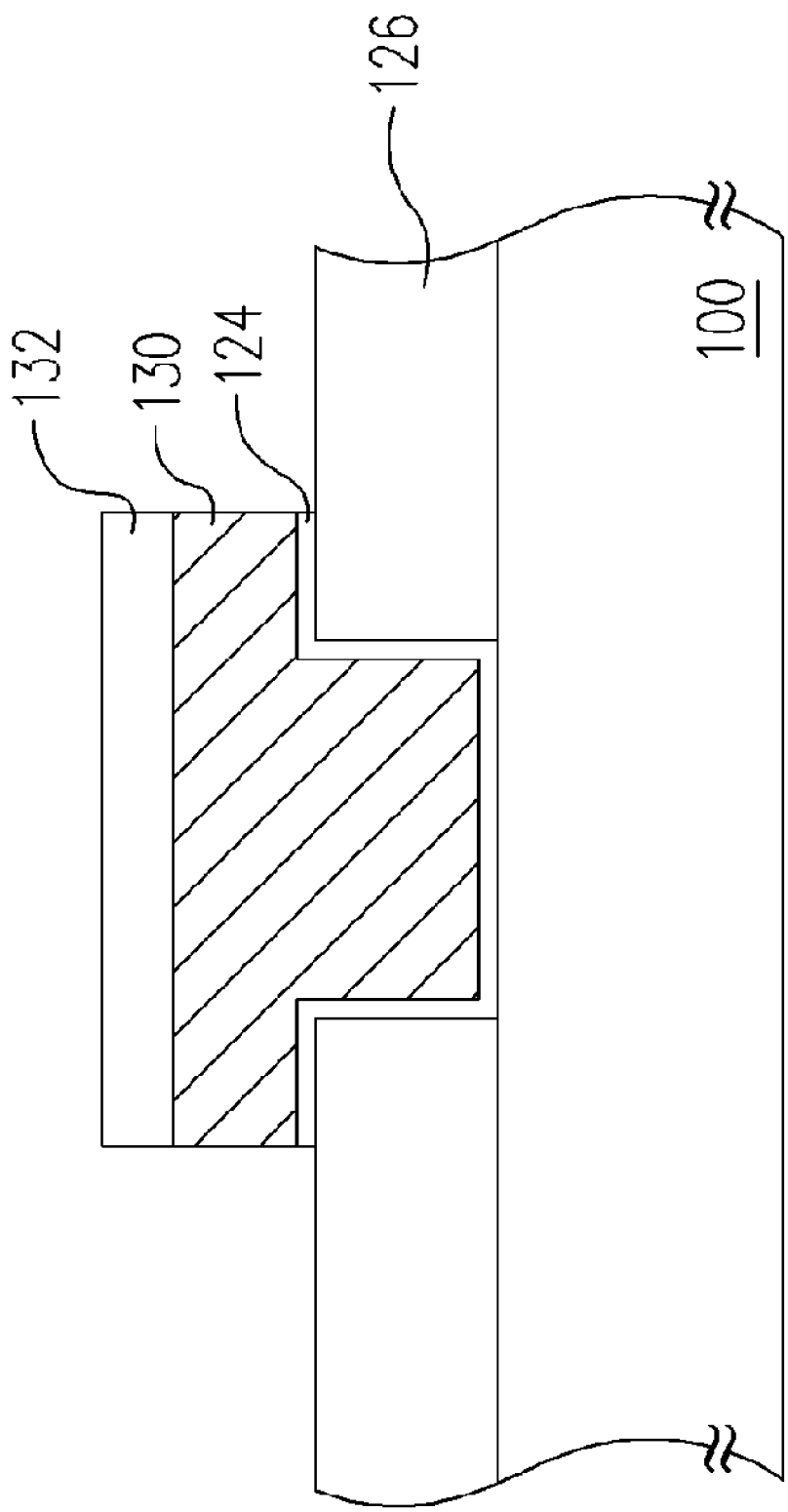

Next, please refer to FIG. 1C and FIG. 3C. The patterned photoresist layer 134 serving as a mask, a portion of the hard mask layer 132, a portion of the conductive layer 130, a portion of the gate dielectric layer 106 and a portion of the dielectric layer 124 are removed in sequence, and the removing method is, for example, by performing a non-isotropic etching process. Accordingly, the gate (conductive layer 130) of the semiconductor device can be defined in the peripheral circuit region 102, and the word line (conductive layer 130) of the memory cell array can be defined in the memory cell region 104. Then, the patterned photoresist layer 134 is removed. In another embodiment, first, the hard mask layer 132 is patterned, the hard mask 132 serving as the mask, and a portion of the conductive layer 130, a portion of gate dielectric layer 106 and a portion of dielectric layer 124 are removed in sequence.

Figure 1D:
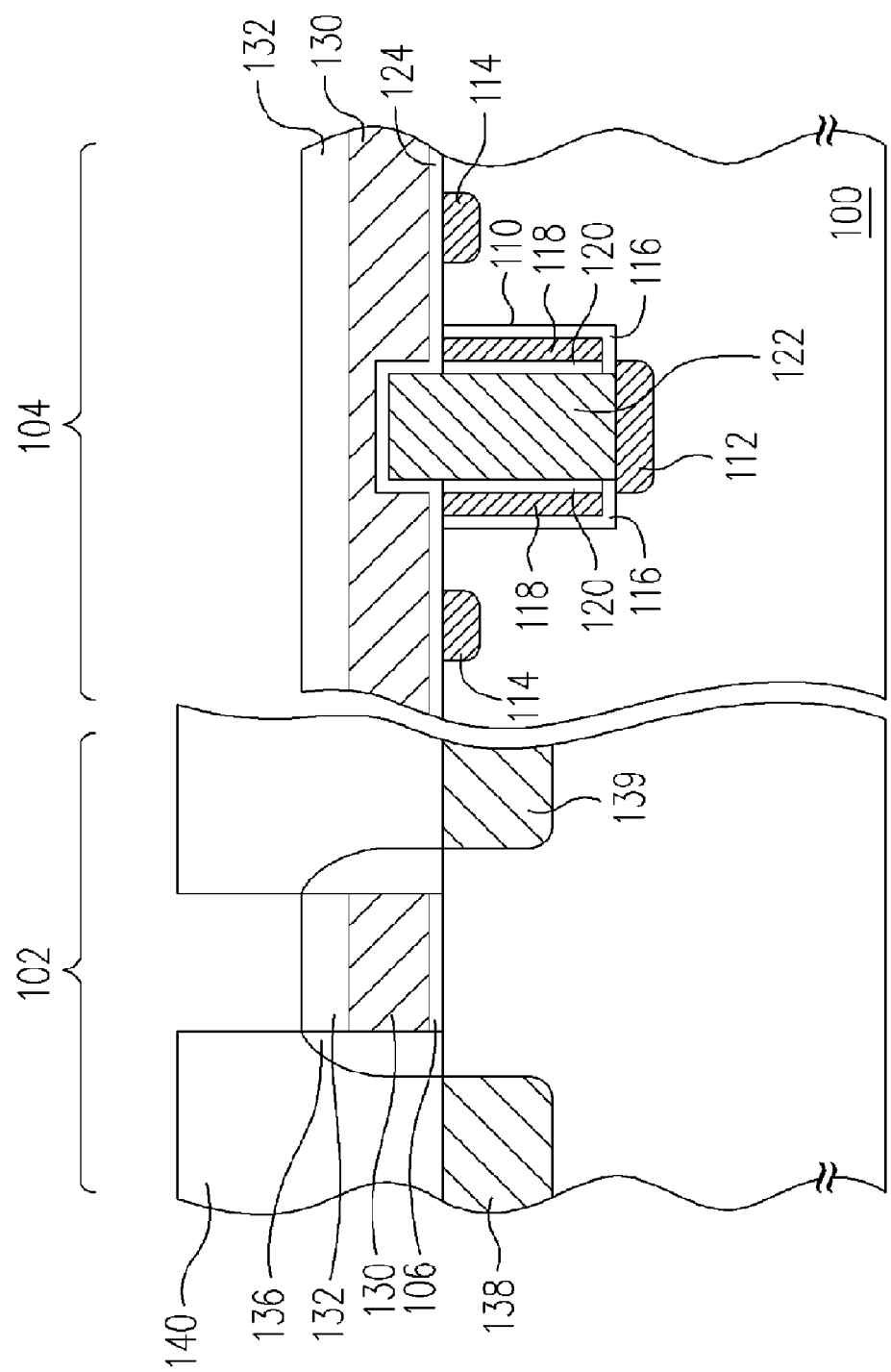
Figure 3D:
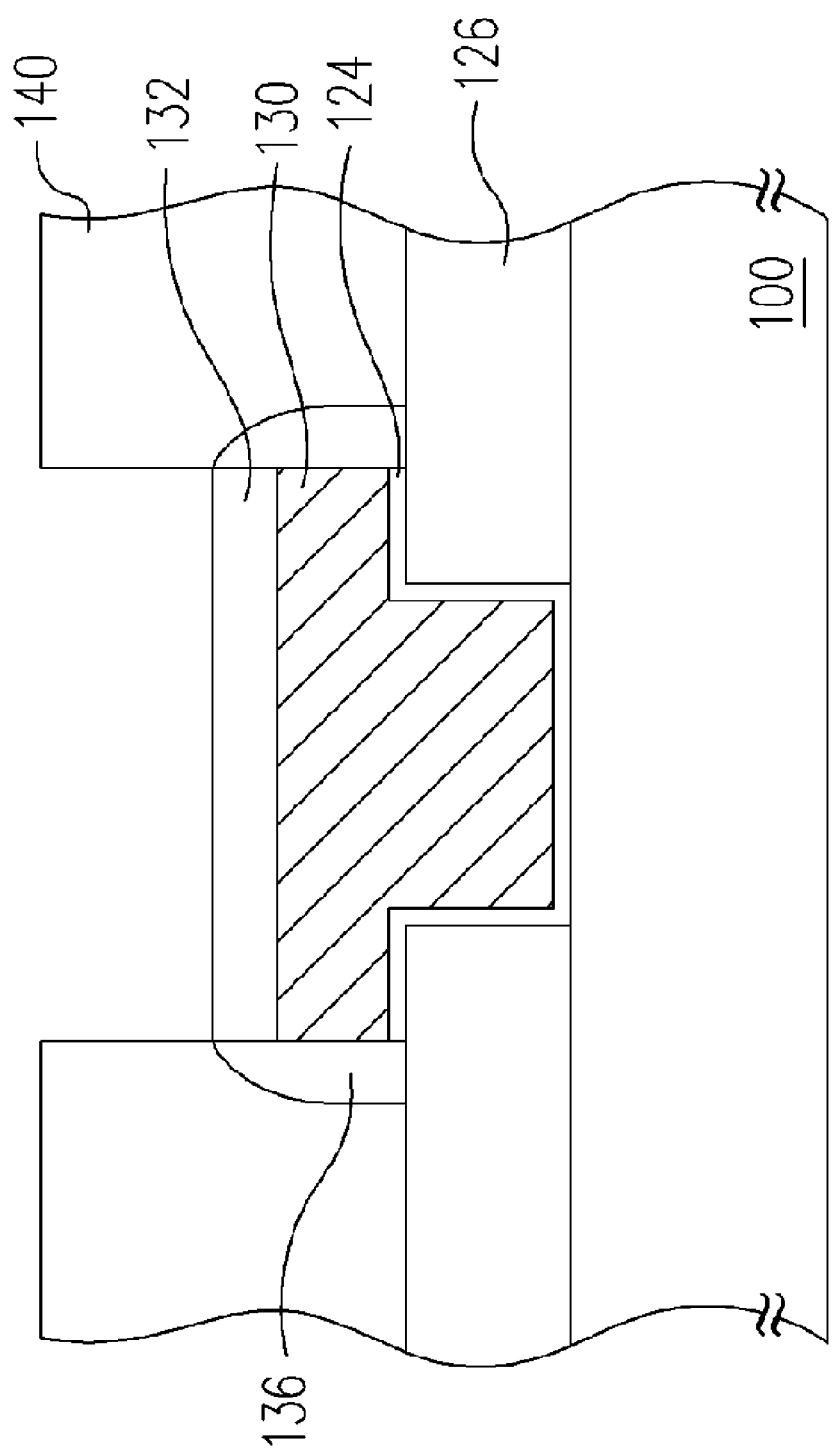

Next, please refer to FIGS. 1D and 3D. A spacer 136 is formed on the sidewalls of the gate dielectric layer 106, the conductive layer 130 and the hard mask layer 132 in the peripheral circuit region 102 and the sidewalls of the conductive layer 130 and the hard mask layer 132 in the memory cell region 104, wherein the material of the spacer 136 is, for example, silicon nitride, and the fabrication method is, for example, first by forming a conformal insulation layer (not shown) on the semiconductor substrate 100 by a chemical vapor deposition process, and then performing a non-isotropic etching process on the insulation layer to form the spacer 136. Next, the source region 138 and drain region 139 are formed in the semiconductor substrate 100 on two sides of the spacer 136 in the peripheral circuit region 102, wherein the fabrication method is, for example, by using the hard mask layer 132 and the spacer wall 136 as the mask, and performing an ion implanting process. Then, a patterned photoresist layer 140 is formed on the semiconductor substrate 100.

Figure 1E:
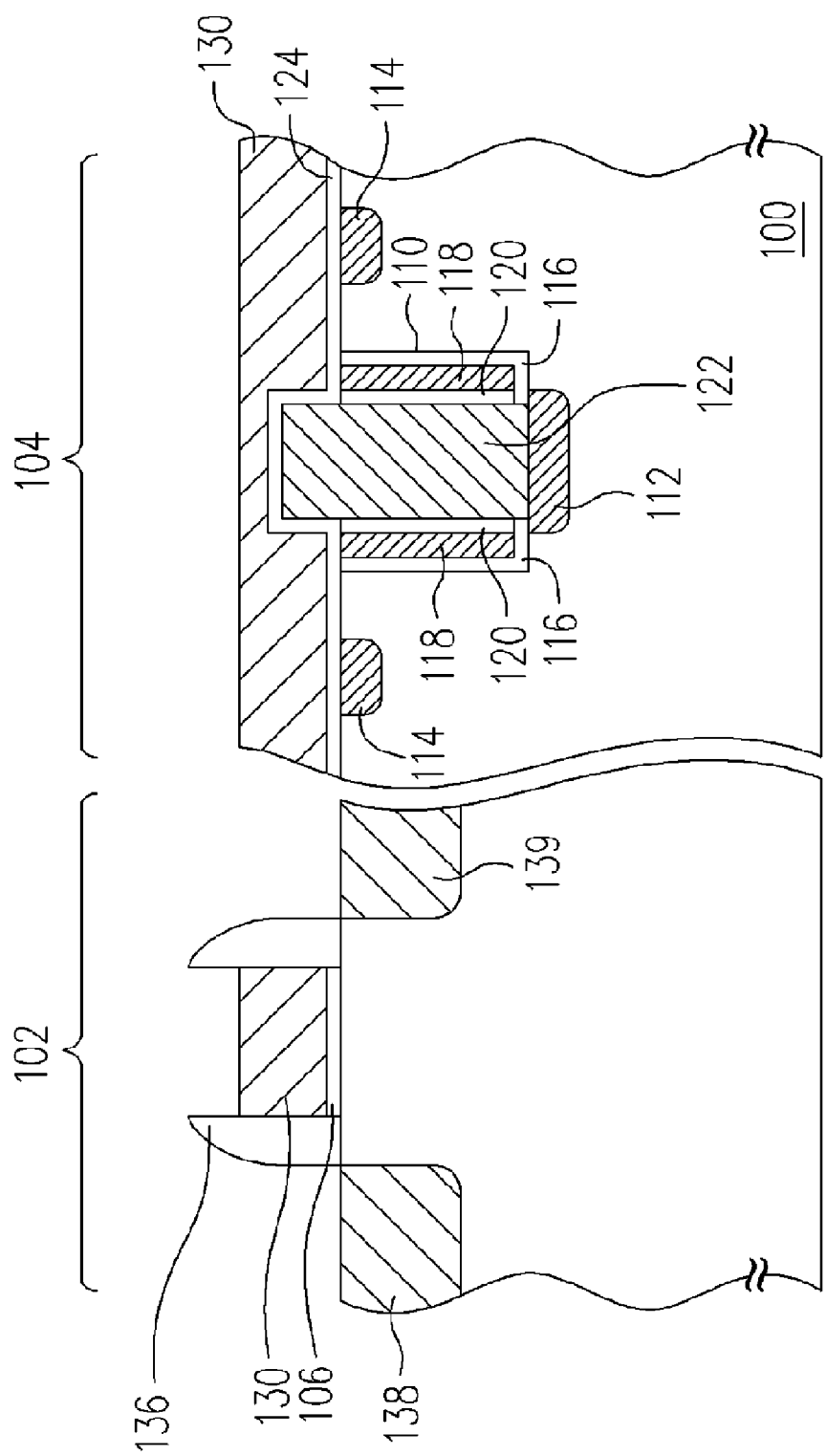
Figure 3E:
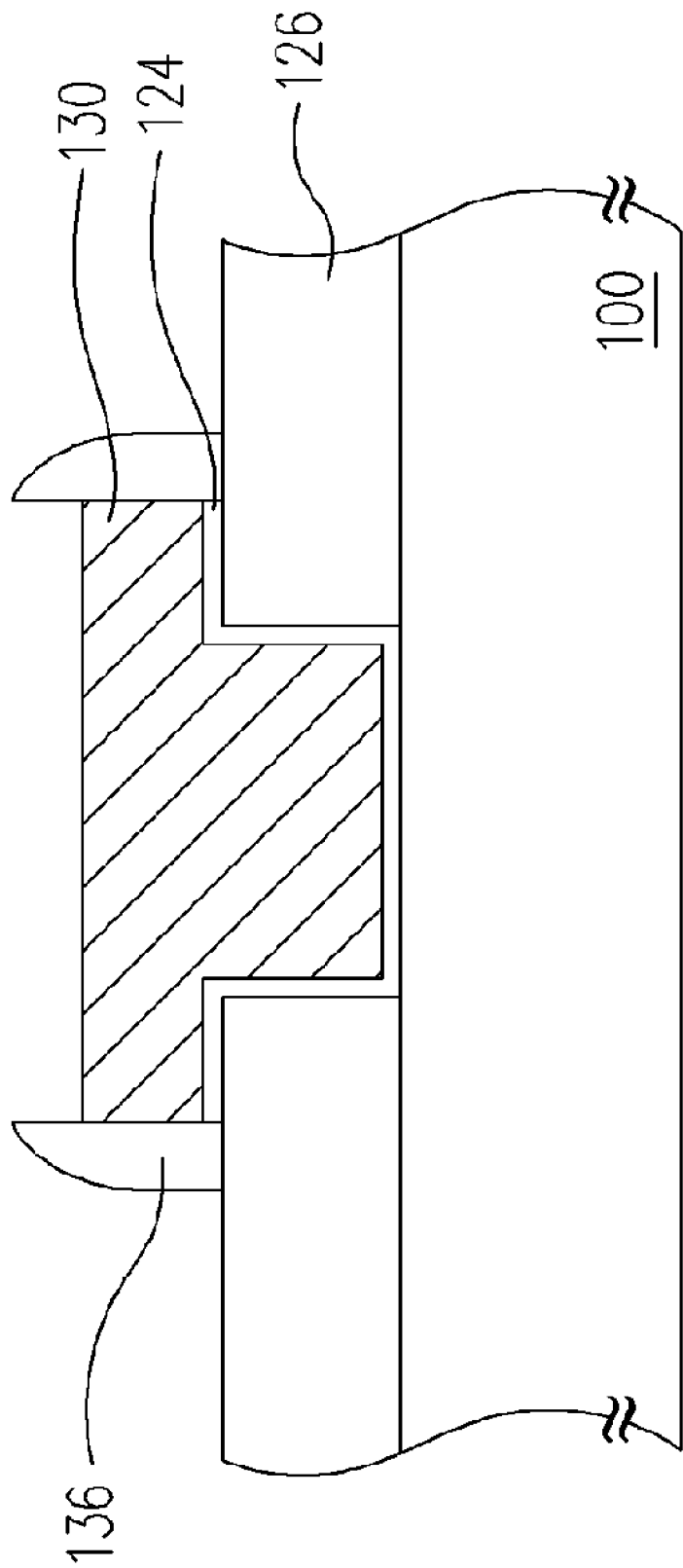

Next, please refer to FIGS. 1E and 3E. The patterned photoresist layer 140 serving as the mask, the hard mask layer 132 is removed. Then, the patterned photoresist layer 140 is removed. Accordingly, the height of the spacer wall 136 may be higher than the conductive layer 130, therefore, when the subsequent pre-sputtering process is performed on the conductive layer 130 to remove the native oxide layer, the pieces generated while the ion smash against the conductive layer will be blocked by the spacer 136 and then concentrate in the region between the spacers 136.

Figure 1F:
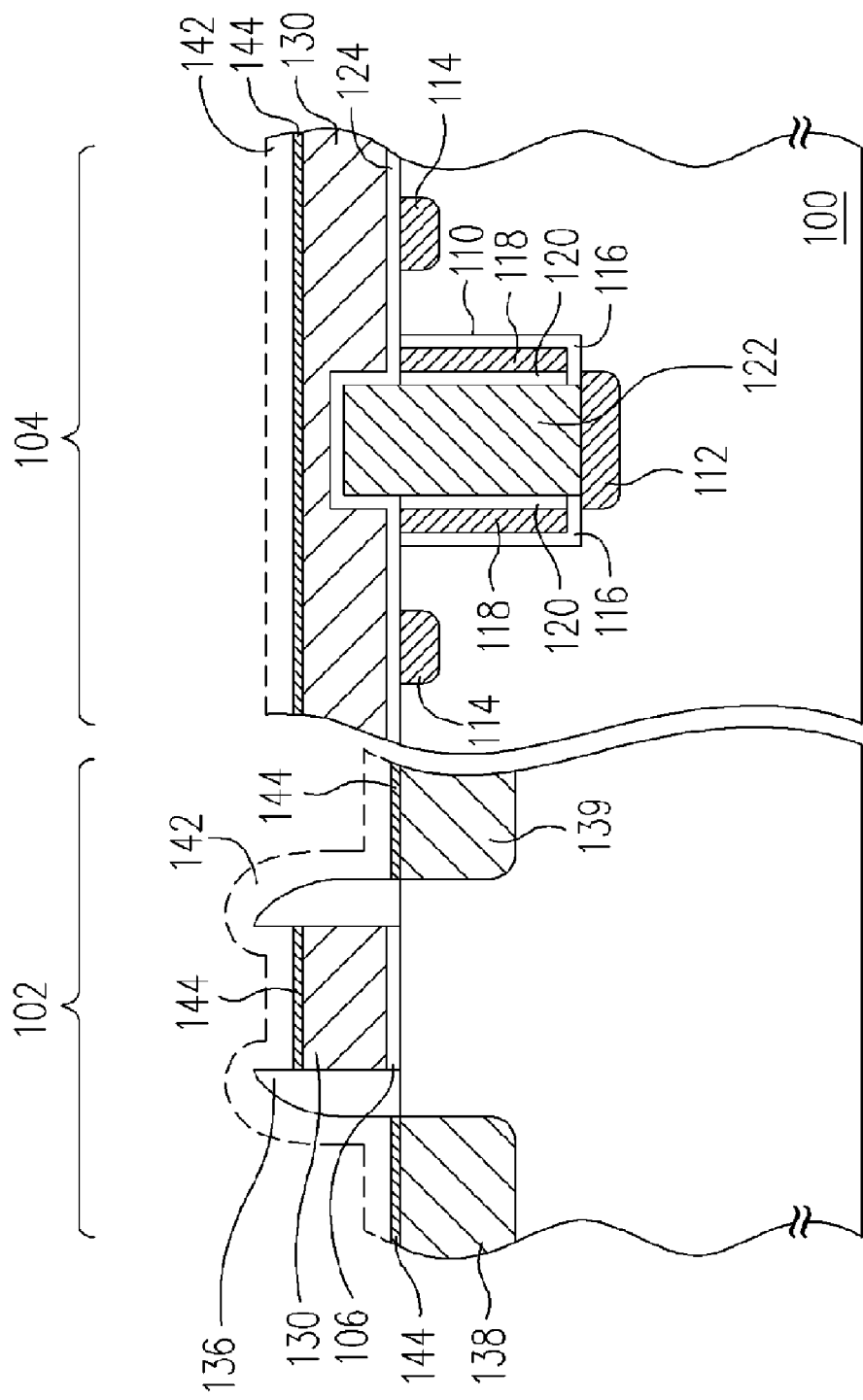
Figure 3F:
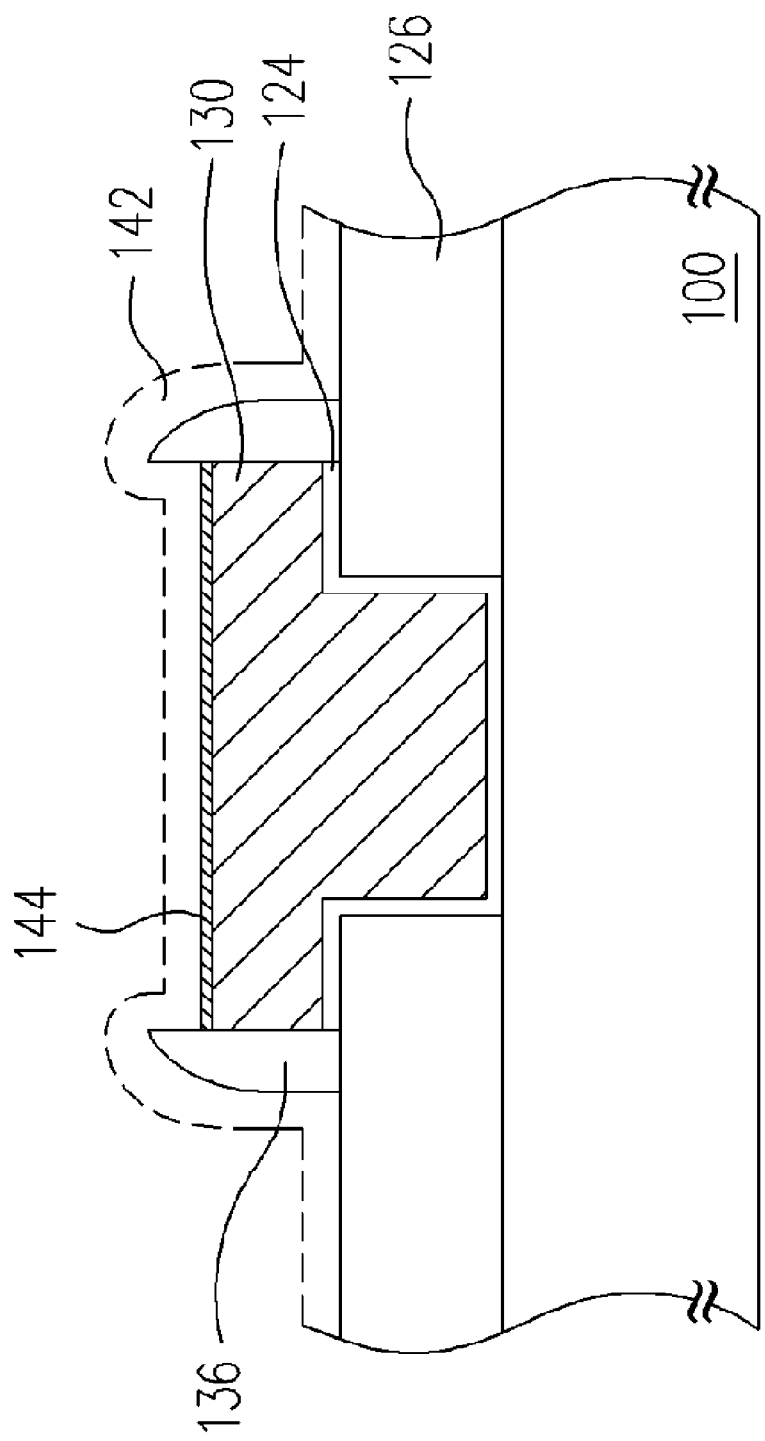

Next, please refer to FIGS. 1F and 3F. A silicide layer 144 is formed on the surfaces of the conductive layer 130, the source region 138 and the drain region 139, and the material of the silicide layer 144 is, for example, cobalt silicate. And, the fabrication method of the silicide layer 144 is: for example, by performing a pre-sputtering process to remove the native oxide layer, then forming a conformal metal layer 142 on the semiconductor substrate 100, which is made of, for example, cobalt, and formed by, for example, a physical vapor deposit process such as sputtering process. Then, a thermal process is performed on the metal layer 142 so that the metal layer 142 can react with the conductive layer 130, and the source region 138 can react with the drain layer 139 to form the silicide 144 on the surface. Afterwards, the metal layer 142 which has not reacted is removed, and the removing method includes, for example, a non-isotropic etching process.

Note that, as the height of the spacer 136 is higher than the conductive layer 130, the polysilicon pieces can be prevented from randomly scattering on the semiconductor substrate 100. Therefore, the problem of the bridge caused by the silicide formed on the polysilicon pieces random scattering on the semiconductor substrate 100 in the conventional fabricating method of salicide can be resolved.

In addition, in the aforementioned method for fabricating the memory unit, the method of fabricating the semiconductor device and word line provided by the present invention is described by the example of the trench memory unit. However, it is apparent to those skilled in the art that the present invention is also suitable for other types of memory units.

In summary, the present invention has at least the following advantages:

1. The method of fabricating the semiconductor device of the present invention can avoid the randomly scattering polysilicon pieces generated in the pre-sputtering process.

2. The method for fabricating the wire with silicide of the present invention can avoid the electronic defect phenomenon resulted from the bridge among conductors.

3. The method of fabricating the semiconductor device and word line according to the present invention can fabricate the gate of the semiconductor device and the word line of the memory unit at the same time, so the manufacturing process is integrated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating semiconductor devices, comprising:
    forming a trench semiconductor device on a substrate, wherein the trench semiconductor device comprises a source line connecting to a source region disposed on the bottom of the trench, and a top surface of the source line is higher than a surface of the substrate;
    forming a first dielectric layer on the trench semiconductor device;
    forming a conductive layer on the first dielectric layer;
    forming a patterned hard mask layer on the conductive layer;
    using a hard mask layer as a mask, and removing a portion of the conductive layer and a portion of the first dielectric layer in sequence;
    forming a spacer on the sidewalls of the first dielectric layer, the conductive layer and the patterned hard mask layer;
    removing the patterned hard mask layer; and
    forming a silicide on the conductive layer.

2. The method for fabricating semiconductor devices as claimed in claim 1, wherein the step for forming the trench semiconductor device comprises:
    forming a trench on the substrate;
    forming a second dielectric layer, a second conductive layer and a third dielectric layer on the sidewalls of the trench in sequence, wherein the trench keeps an opening which exposes a portion of the substrate; and
    forming a source wire in the opening.

3. The method for fabricating semiconductor devices as claimed in claim 1, further comprising performing a pre-sputtering process on conductive layer before the silicide is formed on the conductive layer.

4. The method for fabricating semiconductor devices as claimed in claim 1, further comprising forming a source region and a drain region in the substrate on two sides of the spacer respectively after the spacer is formed on the sidewalls of the first dielectric, the conductive layer and the patterned hard mask layer, and before the patterned hard mask layer is removed.

5. The method for fabricating semiconductor devices as claimed in claim 4, further comprising forming the silicide on the source region and the drain region.

6. The method for fabricating semiconductor devices as claimed in claim 1, wherein the step of the patterned hard mask comprises:
    forming a hard mask layer on the conductive layer;
    forming a patterned photoresist layer on the hard mask layer;
    using the patterned photoresist layer as a mask, and removing a portion of the hard mask layer; and
    removing the patterned photoresist layer.

7. The method for fabricating semiconductor devices as claimed in claim 1, wherein the step for forming the spacer on the sidewalls of the conductive layer and hard mask layer comprises:
    forming a conformal insulation layer on the substrate; and
    performing a non-isotropic etching process on the insulation layer.

8. The method for fabricating semiconductor devices as claimed in claim 1, wherein the step for forming the silicide comprises:
    forming a conformal metal layer on the substrate;
    performing a thermal process on the metal layer to cause the metal layer to react with the conductive layer to generate a silicide layer; and
    removing the metal layer that has not reacted.

9. The method for fabricating semiconductor devices as claimed in claim 1, wherein the material of the patterned hard mask layer comprises silicon oxide.

10. The method for fabricating semiconductor devices as claimed in claim 1, wherein the material of the spacer comprises silicon nitride.

11. The method for fabricating semiconductor devices as claimed in claim 1, wherein the material of the silicide comprises cobalt silicate or tungsten silicate.

* * * * *